(12) United States Patent
Nicholas et al.

(10) Patent No.: US 8,394,664 B2
(45) Date of Patent: Mar. 12, 2013

(54) ELECTRICAL DEVICE FABRICATION FROM NANOTUBE FORMATIONS

(75) Inventors: Nolan Walker Nicholas, Houston, TX (US); W. Carter Kittrell, Houston, TX (US); Myung Jong Kim, Houston, TX (US); Howard K. Schmidt, Cypress, TX (US)

(73) Assignee: William Marsh Rice University, Houston, TX (US)

( * ) Notice: Subject to any disclaimer, the term of this patent is extended or adjusted under 35 U.S.C. 154(b) by 897 days.

(21) Appl. No.: 11/910,522

(22) PCT Filed: Feb. 2, 2007

(86) PCT No.: PCT/US2007/061542
§ 371 (c)(1),
(2), (4) Date: Jul. 27, 2009

(87) PCT Pub. No.: WO2007/092770
PCT Pub. Date: Aug. 16, 2007

(65) Prior Publication Data
US 2010/0140591 A1    Jun. 10, 2010

Related U.S. Application Data

(60) Provisional application No. 60/764,703, filed on Feb. 2, 2006.

(51) Int. Cl.
*H01L 51/10* (2006.01)
*H01L 51/40* (2006.01)
(52) U.S. Cl. .......................... 438/99; 438/82
(58) Field of Classification Search ............. 438/82–86, 438/99, E39.007, E51.006–E51.007
See application file for complete search history.

(56) References Cited

U.S. PATENT DOCUMENTS

| | | | |
|---|---|---|---|
| 6,759,693 | B2 | 7/2004 | Vogeli et al. |
| 6,900,580 | B2 | 5/2005 | Dai et al. |
| 7,038,299 | B2 | 5/2006 | Furukawa et al. |
| 7,071,023 | B2 | 7/2006 | Bertin et al. |
| 7,081,385 | B2 | 7/2006 | Farnworth et al. |
| 7,094,692 | B2 | 8/2006 | Horibe et al. |
| 7,160,531 | B1 | 1/2007 | Jacques et al. |
| 7,161,286 | B2 | 1/2007 | Liu et al. |
| 2002/0001905 | A1 | 1/2002 | Choi et al. |
| 2003/0178617 | A1 | 9/2003 | Appenzeller et al. |
| 2005/0106846 | A1 | 5/2005 | Dubin et al. |
| 2005/0167655 | A1 | 8/2005 | Furakawa et al. |
| 2005/0167755 | A1 | 8/2005 | Dubin et al. |
| 2005/0179029 | A1 | 8/2005 | Furakawa et al. |
| 2006/0290343 | A1* | 12/2006 | Crafts et al. ............... 324/158.1 |

OTHER PUBLICATIONS

Zhang, et al., "Selective Etching of Metallic Carbon Nanotubes by Gas-Phase Reaction", Science, 314:2006, pp. 974-977.
Collins, et al., "Engineering Carbon Nanotubes and Nanotube Circuits Using Electrical Breakdown", Science, 292:2001, pp. 706-709.
Talapatra, et al., "Direct growth of aligned carbon nanotubes on bulk metals", Nature Nanotechnology, 1:2006, pp. 112-116.

(Continued)

*Primary Examiner* — Cuong Q Nguyen
(74) *Attorney, Agent, or Firm* — Winstead PC

(57) ABSTRACT

A method for forming nanotube electrical devices, arrays of nanotube electrical devices, and device structures and arrays of device structures formed by the methods. Various methods of the present invention allow creation of semiconducting and/or conducting devices from readily grown SWNT carpets rather than requiring the preparation of a patterned growth channel and takes advantage of the self-controlling nature of these carpet heights to ensure a known and controlled channel length for reliable electronic properties as compared to the prior methods.

12 Claims, 7 Drawing Sheets

OTHER PUBLICATIONS

Farmer, et al., "ALD of High-k Dielectrics on Suspended Functionalized SWNTs", Electrochemical and Solid State Letters, 8:2005, pp. G89-G91.

Colorado, et al., "Silica-Coated Single-Walled Nanotubes: Nanostructure Formation", Chem. Mater., 16:2004, pp. 2691-2693.

Oldenburg, et al., "Nanoengineering of optical resonances", Chem. Phys. Lett., 288:1998, pp. 243-247.

Wenseleers, et al., "Efficient Isolation and Solubilization of Pristine Single-Walled Nanotubes in Bile Salt Micelles", Adv. Func. Mater., 14:2004, pp. 1105-1112.

Yang, et al, "Multicomponent interposed carbon nanotube micropatterns by region-specific contact transfer and self-assembling", J. Phys. Chem. B, 107:2003, pp. 12387-12390.

Choi, et al., "Aligned carbon nanotubes for nanoelectronics", Nanotechnology, 15:2004, pp. S512-S516.

Hata, et al., "Water-Assisted Highly Efficient Synthesis of Impurity-Free Single-Walled Carbon Nanotubes", Science, 306:2004, pp. 1362-1364.

Fischer, et al., "Metallic resistivity in crystalline ropes of single-wall carbon nanotube", Phys. Rev. B, 55:1997, pp. R4921.

Liu, et al, "SWNT/PAN composite film-based supercapacitors", Carbon, 41:2003, pp. 2440-2442.

Futaba, et al., "Shape-engineerable and highly densely packed single-walled carbon nanotubes and their application as super-capacitor electrodes", Nature Materials, 5:2006, pp. 987-994.

Du, et al, "High power density supercapacitors using locally aligned carbon nanotube electrodes", Nanotechnology, 16:2005, pp. 350-353.

Kim, et al, "Efficient Transfer of a VA-SWNT Film by a Flip-Over Technique", J. Am. Chem. Soc., 128:2006, pp. 9312-9313.

Qiu, et al, "Individual alumina nanotubes coaxially wrapping carbon nanotubes and nanowires", Thin Solid Films, 478:2005, pp. 56-60.

Whitsitt, et al., "Silica Coated Single Walled Carbon Nanotubes", Nano Lett., 3:2003, pp. 775-778.

Burke, "An RF Circuit Model for Carbon Nanotubes", IEEE Trans. Nanotech. 2:2003, pp. 55-58.

Zhao, et al., "Electrochemical capacitance of a leaky nanocapacitor", Phys. Rev. B, 60:1999, pp. 16730-16740.

Maruyama, et al., "Low-temperature synthesis of high-purity single-walled carbon nanotubes from alcohol", Chem. Phys. Lett., 360:2002, pp. 229-234.

Murakami, et al., "Direct synthesis of high-quality single-walled carbon nanotubes on silicon and quartz substrates", Chem. Phys. Lett., 377:2003, pp. 49-54.

Chattopadhyay, et al., "Metal-Assisted Organization of Shortened Carbon Nanotubes in Monolayer and Multilayer Forest Assemblies", J. Am. Chem. Soc., 123:2001, pp. 9451-9452.

Burke, "AC performance of nanoelectronics: towards a ballistic THz nanotube transistor", Solid-State Electronics, 48:2004, pp. 1981-1986.

Murakami, et al., "Growth of vertically aligned single-walled carbon nanotube films on quartz substrates and their optical anisotropy", Chem. Phys. Lett., 385:2004, pp. 298-303.

Xu, et al., "Vertical Array Growth of Small Diameter Single-Walled Carbon Nanotubes", J. Am. Chem. Soc., 128:2006, pp. 6560-6561.

Murakami, et al., "Detachment of vertically aligned single-walled carbon nanotube films from substrates and their re-attachment to arbitrary surfaces", 422:2006, pp. 575-580.

Fahlman, et al., "CVD of Conformal Alumina Thin Films via Hydrogenolysis of AlH3(NMe2Et)", Adv. Mater. Opt. Electron. 10:2000, pp. 135-144.

* cited by examiner

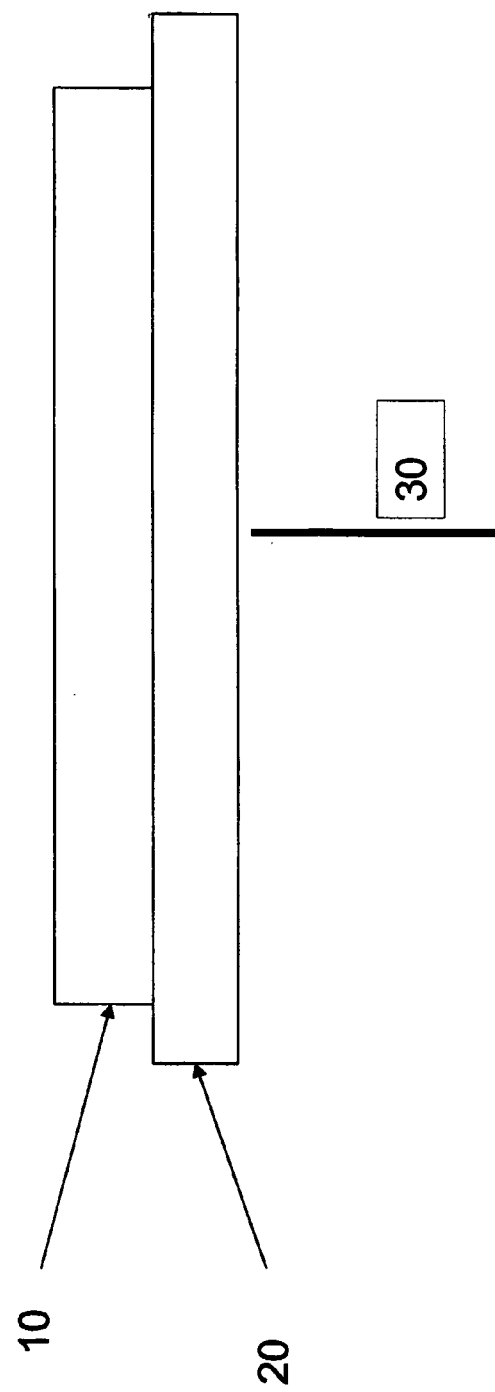
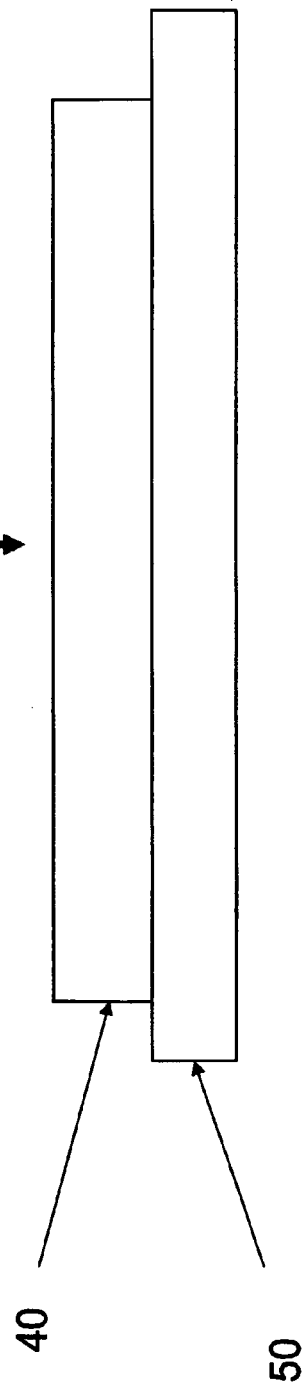
Figure 1
Figure 2

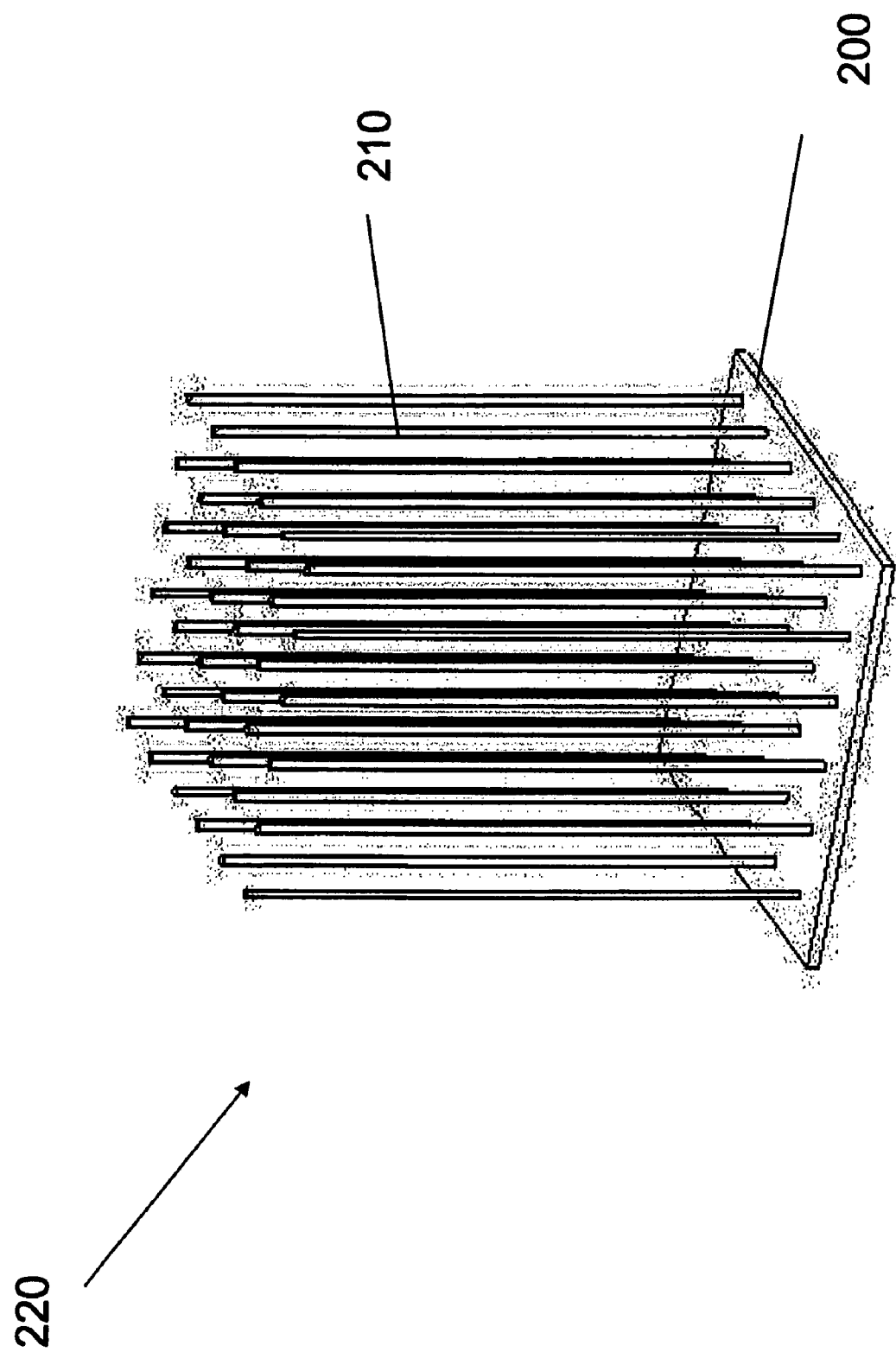

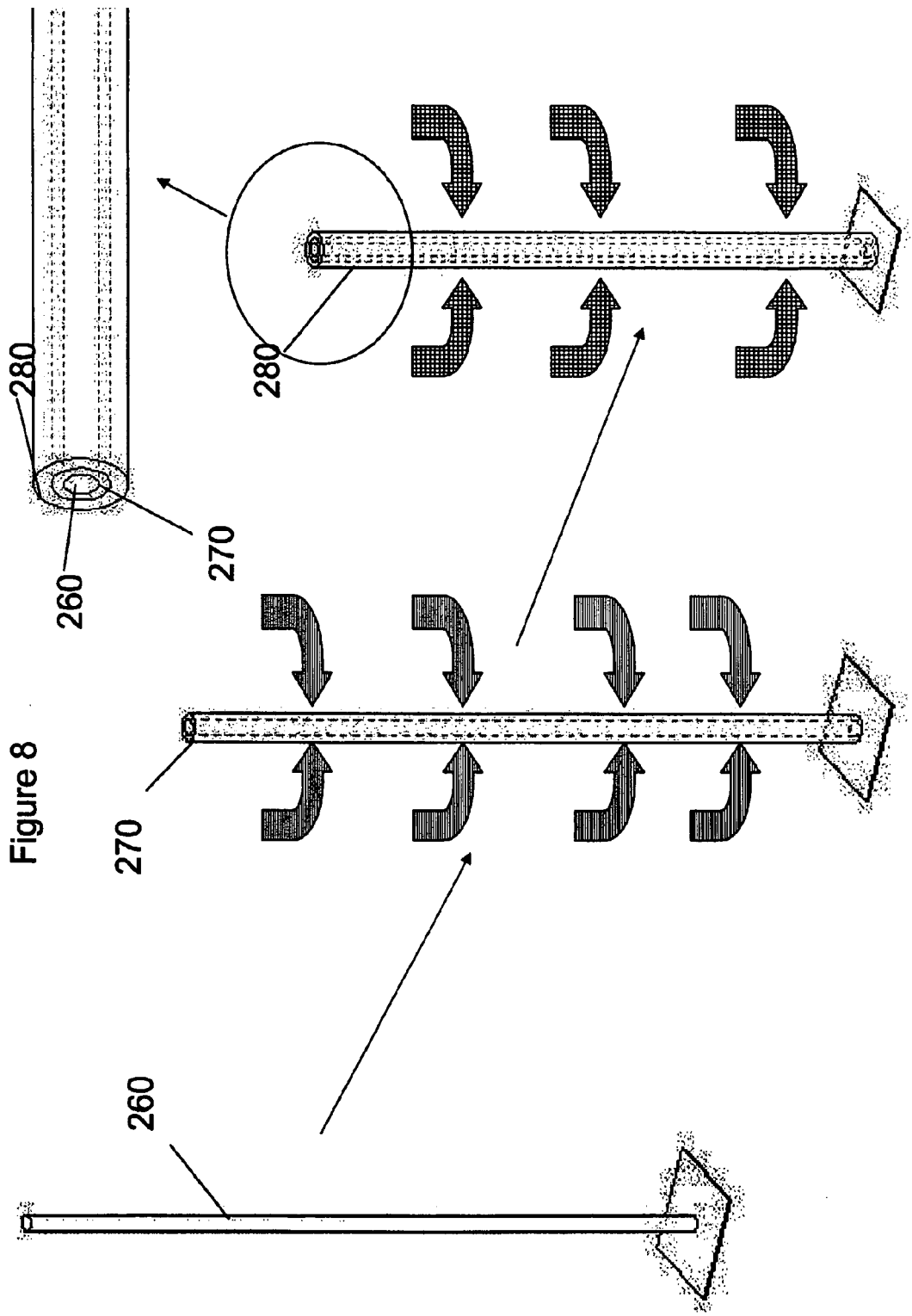

ELECTRICAL DEVICE FABRICATION FROM NANOTUBE FORMATIONS

STATEMENT REGARDING FEDERALLY SPONSORED RESEARCH

This invention was made with government support under Grant Number DE-AC05-00OR22725 awarded by the Department of Energy and Grant Number FA9550-04-1-0452 awarded by the Air Force Office of Scientific Research. The Government has certain rights in the invention.

FEDERALLY-SPONSORED RESEARCH

This invention was made, in part, with support from the Department of Energy, Grant No. RU416000, and from the Air Force Office of Scientific Research, Grant No. FA 9550-04-1-0452.

BACKGROUND OF THE INVENTION

1. Field of the Invention

The present invention generally relates to transistor and capacitor fabrication from nanotube formations.

2. Background

Traditional field effect transistors (FET's), capacitors, and other electrical devices are familiar conventional devices commonly incorporated as a fundamental building block into many integrated circuit (IC) chips.

FET's operate by providing resistance in a channel region separating a source and a drain. Carriers flow from the source to the drain through the channel in proportion to the variation in electrical resistivity. Electrons are responsible for channel conduction in n-channel FET's and, in p-channel FET's, holes are responsible for conduction in the channel.

FET's can be classified into horizontal architectures and vertical architectures. Horizontal FET's exhibit carrier flow from source to drain in a direction parallel to the horizontal plane of the substrate on which they are formed. Vertical FET's exhibit carrier flow from source to drain in a direction vertical to the horizontal plane of the substrate on which they are formed.

It is commonly understood that vertical FET's provide and/or allow for a shorter switching time because channel length for vertical FET's does not depend on the smallest feature size resolvable by, for example, lithographic equipment and methods. Therefore, vertical FET's possess a higher power handling capacity than typical horizontal FET's.

To improve speed, a push has resulted in the downward scaling of FET dimensions. This downward scaling has improved performance and increased the functional capability of FET's packed on an IC chip. However, traditional materials of construction for FET's cannot be reduced much more with current manufacturing methods. Accordingly, there was a need for a new material from which to manufacture FET's, i.e., nanotubes, such as carbon nanotubes.

Batteries, capacitors, and supercapacitors are types of energy storage devices. In measuring performance, typical characteristics of measurement comprise the devices energy density, the amount of energy that can be stored per unit weight or volume, and power density, the rate at which an amount of energy can be transferred in or out of that unit weight or volume.

Batteries are common energy storage devices for providing portable power. Capacitors are also common energy storage devices. Although capacitors have much higher energy transfer rates than batteries and can withstand orders of magnitude more charging cycles, they are limited by their low energy storage capacity. Supercapacitors, also known as ultracapacitors, electrochemical capacitors or electrical double-layer capacitors, are energy storage devices which combine the high energy storage potential of batteries with the high energy transfer rate and high recharging capabilities of capacitors. However, as with FET's, the art field desires to further decrease the size and/or improve the operating characteristics of these devices.

Carbon nanotubes are nanoscale high-aspect-ratio cylinders consisting of hexagonal rings of carbon atoms that may assume either a semiconducting electronic state or a conducting electronic state. Semiconducting carbon nanotubes have been used to form hybrid devices, such as hybrid FET's. In particular, FET's have been fabricated using a single semiconducting carbon nanotube as a channel region. Typically, ohmic contacts at opposite ends of the semiconducting carbon nanotube extending between a source electrode and a drain electrode situated on the surface of a substrate.

A gate electrode is defined in the substrate underlying the carbon nanotube and generally between the source and drain electrodes. An oxidized surface of the substrate defines a gate dielectric situated between the buried gate electrode and the carbon nanotube. Such FET's switch reliably while consuming significantly less power than a comparable silicon-based device structure due to the small dimensions of the carbon nanotube.

Accordingly, much attention has been given to the use nanomaterials in electrical devices.

Carbon nanotubes are nanoscale high-aspect-ratio cylinders consisting of hexagonal rings of carbon atoms that may assume either a semiconducting electronic state or a conducting electronic state. Many methods exist for forming and/or creating nanotubes and nanotube arrays. A conventional method of forming carbon nanotubes utilizes a chemical vapor deposition (CVD) process. Specifically, the CVD process directs a flow of a carbonaceous reactant to a catalyst material located on the substrate, where the reactant is catalyzed to synthesize carbon nanotubes. The carbon nanotubes are capable of being lengthened by insertion of activated carbon atoms at the interface with the catalyst material. Typically, the carbon nanotubes are then collected for an end use or further processing.

Carbon nanotubes typically range from a few to tens of nm in diameter, and are as long as a few nanometers in length. Because of its one-dimensional electronic properties due to this shape anisotropy, the carbon nanotube characteristically has a maximum current density allowing the flowing of current without disconnection of 1,000,000 A per square centimeter, which is 100 times or more as high as that of a copper interconnect. Further, with respect to heat conduction, the carbon nanotube is ten times as high in conductivity as copper.

In terms of electric resistance, it has been reported that transportation without scattering due to impurities or lattice vibration (phonon) can be realized with respect to electrons flowing through the carbon nanotube. It is known that resistance per carbon nanotube, in various instances, is approximately 6.45 k$\Omega$. However, other resistances are contemplated in various embodiments of the present invention.

Further desirable attributes of a carbon nanotube electrode material include such factors as high surface area for the accumulation of charge at the electrode/electrolyte interface, good intra- and interparticle conductivity in the porous matrices, good electrolyte accessibility to the intrapore surface area, chemical stability and high electrical conductivity. Commonly used carbonaceous material used for the construction of carbon nanotubes include such materials as activated carbon, carbon black, carbon fiber cloth, highly oriented pyrolytic graphite, graphite powder, graphite cloth, glassy carbon, carbon aerogel, and/or the like.

Accordingly, the art field is in search of improved methods of manufacturing electrical devices out of nanotube material, such as carbon nanotubes.

SUMMARY OF THE INVENTION

These and other features and advantages of the invention will be apparent to those skilled in the art from the following detailed description of various embodiments, taken together with the accompanying figures and claims, in which:

Various embodiments of the present invention comprise processes for electrical device fabrication and, more particularly, to methods of constructing vertical carbon nanotube electrical devices, and device structures and arrays of device structures formed by such processes and/or methods.

Generally embodiments of the present invention comprise a method for fabricating an electrical device comprising the steps of:

1) growing a vertically aligned nanotube carpet;
2) transferring said nanotube carpet onto a second substrate;
3) insulating said nanotube carpet and said second substrate; and
4) applying a conductive layer to said nanotube carpet, wherein an electrical device is fabricated and/or an array of electrical devices is fabricated.

In various further embodiments, an electrical device is fabricated. In further embodiments, an array of devices if fabricated.

Various further embodiments generally relate to methods of reducing the heat generated from an integrated circuit comprising the step of replacing said integrated circuit's silicon with a carbon nanotube formation as herein disclosed. Further, because carbon nanotubes are more thermally conductive than silicon and more resilient to high temperatures, devices fabricated according to this patent will be more thermally tolerant and have better thermal dissipation than most silicon devices.

Various further embodiments generally relate to methods of increasing the operating speed of an electrical device comprising the step of replacing said integrated circuit's silicon with a carbon nanotube formation as herein disclosed.

BRIEF DESCRIPTION OF THE FIGURES

In order that the manner in which the above-recited and other enhancements and objects of the invention are obtained, a more particular description of the invention briefly described above will be rendered by reference to specific embodiments thereof which are illustrated in the appended drawings. Understanding that these drawings depict only typical embodiments of the invention and are therefore not to be considered limiting of its scope, the invention will be described with additional specificity and detail through the use of the accompanying drawings in which:

FIG. 1 is an illustration of a nanotube carpet growth on a substrate.

FIG. 2 is an illustration of a nanotube carpet growth from FIG. 1 being flipped, by "flip-over," to another substrate.

FIG. 7 is an illustration of an expanded view of a vertically grown nanotube carpet.

FIG. 8 is an illustration of a coating process performed on a vertically grown nanotube.

DETAILED DESCRIPTION OF THE INVENTION

Figure 3:
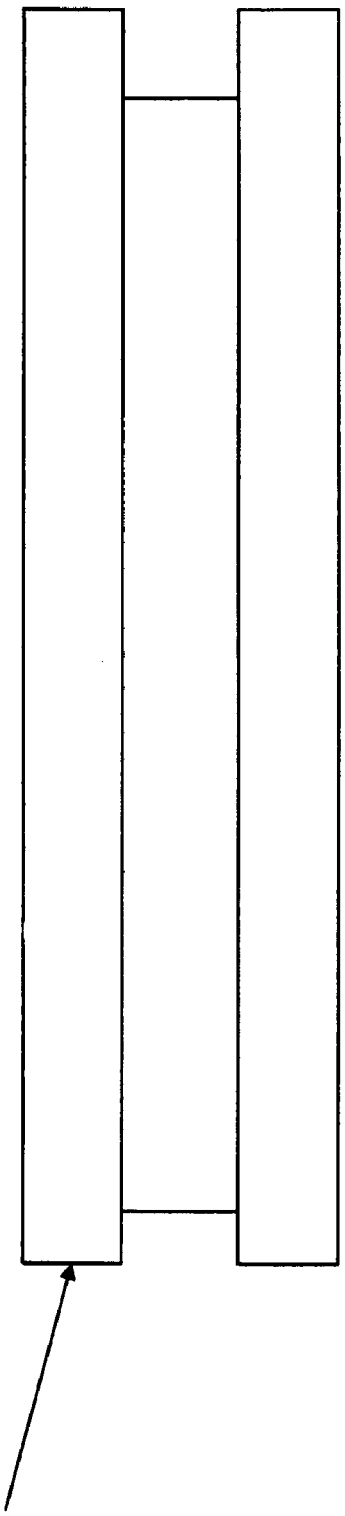
FIG. 3 is an illustration of a nanotube carpet growth from FIG. 2 contacted on an upper surface.

The particulars shown herein are by way of example and for purposes of illustrative discussion of the preferred embodiments of the present invention only and are presented in the cause of providing what is believed to be the most useful and readily understood description of the principles and conceptual aspects of various embodiments of the invention. In this regard, no attempt is made to show structural details of the invention in more detail than is necessary for the fundamental understanding of the invention, the description taken with the drawings making apparent to those skilled in the art how the several forms of the invention may be embodied in practice.

The following definitions and explanations are meant and intended to be controlling in any future construction unless clearly and unambiguously modified in the following examples or when application of the meaning renders any construction meaningless or essentially meaningless. In cases where the construction of the term would render it meaningless or essentially meaningless, the definition should be taken from Webster's Dictionary, $3^{rd}$ Edition.

As used herein, the term "attached," or any conjugation thereof describes and refers the at least partial connection of two items.

As used herein, the term "dielectric" means and refers to a substance in which an electric field may be maintained with zero or near-zero power dissipation, i.e., the electrical conductivity is zero or near zero. In various embodiments, a dielectric material is an electrical insulator.

As used herein, the term "electrical device" means and refers to at least one semiconductor device and/or at least one conductor device used in or with a or a formation of transistors, capacitors, interconnections, batteries, supercapacitors, and/or the like, particularly various memory devices, such as, but not limited to DRAM, SRAM, SCRAM, EDRAM, VDRAM, NVSRAM, NVDRAM, DPSRAM, PSDRAM, transistor/capacitor cell devices, vias or interconnects, and vertical stacks of logic gates. However, other devices utilizing transistors at least one transistors, capacitors, interconnections, and/or the like are to be included within this definition.

As used herein, a "fluid" is a continuous, amorphous substance whose molecules move freely past one another and that has the tendency to assume the shape of its container, for example, a liquid or a gas.

As used herein, the term "integral" means and refers to a non-jointed body.

As used herein, the term "MOCVD" means and refers to Metal Organic Chemical Vapor Deposition and involves passing metal oxides across a work piece in an inert gas to deposit a layer of metal oxide on the surface.

As used herein, the term "optical anisotropy" means and refers to a the property of being optically directionally dependent. Stated another way, it is the behavior of a medium, or of a single molecule, whose effect on electromagnetic radiation depends on the direction of propagation of the radiation.

As used herein, the term The term "trace" is not intended to be limiting to any particular geometry or fabrication technique and instead is intended to broadly cover an electrically conductive path.

Other than in the operating examples, or where otherwise indicated, all numbers expressing quantities of ingredients or reaction conditions used herein are to be understood as modified in all instances by the term "about".

References herein to terms such as "vertical" and "horizontal" are made by way of example to establish a frame of reference. The term "horizontal" as used herein is defined as a plane parallel to the conventional plane or surface of substrate. The term "vertical" refers to a direction perpendicular to the horizontal, as defined above. Terms, such as "on", "above", "below", "side" (as in "sidewall"), "higher", "lower", "over", "beneath" and "under", are defined with respect to the horizontal plane.

As such, various embodiments of the present invention comprise processes for electrical device fabrication and, more particularly, to methods of constructing vertical carbon nanotube electrical devices, and device structures and arrays of device structures formed by such processes and/or methods.

Accordingly, various embodiments of the present invention provide electrical devices, wherein the devices include a nanotube, for example a carbon nanotube. Also provided are methods for fabrication of carbon nanotube electrical devices. The present invention need not be limited to the particular electrical devices illustrated in the figures nor the particular embodiments of the same. Other electrical devices or embodiments of the electrical devices illustrated in the drawings may be formed using the methods of the present invention. For example, the devices and methods provided herein may include individual carbon nanotubes or collections of carbon nanotubes.

Growth

To begin, a carpet or film of nanotubes is needed. In an embodiment, the nanotubes are carbon nanotubes. In an alternate embodiment, the nanotubes are silicon nanotubes. Generally, the material of fabrication of any particular nanotube can be varied as desired and/or required for a particular application.

In various embodiments, the carpet of nanotubes is a Single-walled carbon nanotubes (SWNT). Although, in alternate embodiments, multi-walled carbon nanotubes are used (MWNTs). The growth of such carpets is a routine matter in the art. Certain nonexclusive methods for growth of nanotube carpets include selective generation by the laser furnace method, chemical vapor deposition (CVD) techniques such as the high-pressure CO (HiPco) method, and/or the like. Generally, any method of fabrication of nanotubes may be used.

However, for most electrical devices, in addition to synthesis, the controlled positioning of the nanotubes on a substrate is also important. The controlled placement of the nanotubes is a concern and design characteristic for applications to field emission transistors (FET), chemical sensors, optical devices, and/or the like. Typically, it is easier to control the placement of the a nanotube formation when using a vertical alignment of the nanotubes, such that the nanotubes grow vertically from the substrate.

A substrate of the present invention may be chosen from any suitable substrate for electrical devices. In various embodiments, substrate materials include, but are not limited to, doped or undoped silicon, doped or undoped polycrystalline silicon, gallium arsenide, gallium phosphide, indium phosphide, and/or the like. Generally, any material can be used that does not adversely affect either or both of the growth of the nanotubes or properties of the electrical device.

In an embodiment, a vertical alignment of nanotubes is achieved by a CVD procedure as is common in the art. In an embodiment, the CVD process is an alcohol-CVD technique as disclosed in Maruyama, S. et al., Chem. Phys. Lett. 2002, 360, 229 and Murakami et al., Chem. Phys. Lett. 2003, 377, 49.

In an alternate embodiments, vertical arrays of nanotubes can also be formed from premade nanotubes. Chatttopadhyay, et al., "Metal-Assisted Organization of Shortened Carbon Nanotubes in Monolayer and Multilayer Forest Assemblies," *J. Am. Chem. Soc.* 2001, 123, 9451-9452. These arrays can be deposited directly on conductive surfaces and could be used to form the nanotube channels in this device rather than using a vertical array of grown nanotubes. Accordingly, this is an alternate embodiment for forming nanotube channels of the present invention.

In various embodiments, the prepared specimen exhibits optical anisotropy due to the alignment of the nanotubes.

In various embodiments, the resistance of a nanotube, and/or nanotube carpet, of an embodiment of the present invention is between about 0.1 k$\Omega$ and about 10.0 k$\Omega$. In an alternate embodiment, the resistance of a nanotube of an embodiment of the present invention is between about 2.0 k$\Omega$ and about 8.0 k$\Omega$. In an alternate embodiment, the resistance of a nanotube of an embodiment of the present invention is between about 3.0 k$\Omega$ and about 7.0 k$\Omega$. In general, any resistance can be chosen to function with the desired process.

In various embodiments, composition of the carpets with respect to tube type is controlled, such that metallics are eliminated from the carpet. The removal of metallics may be accomplished by any method common in the art and anywhere within the process of fabricating/growing the carpet. Exemplary, non-limiting embodiments include, but are not limited to wet chemical selective functionalization, high current metallic tube burnout, and/or the like. In an embodiment to remove metallic tube methane plasma is used to preferentially attack metallic SWNT as reported in. Zhang et al., "Selective Etching of Metallic Carbon Nanotubes by Gas-Phase Reaction," *Science* 314, 974 (2006).

However, in an alternate embodiment, a SWNT can be grown onto metal films with thin insulator layers and still retain some conductivity. Talapatrala, et al., "Direct Growth of aligned carbon nanotubes on bulk metals," Department of Material Science & Engineering, Rensselaer Poytechnic Institute, 22 Oct. 2006. Further, a MWNT is capable of being grown directly onto metal substrates and have conductivity through the structure In various embodiments, synthesized carbon nanotubes randomly form in a mixture or collection of conducting and semiconducting electronic states when grown by conventional synthesis processes. In such cases, it is desirable to separate the two components. In fact, in various embodiments, the inability or failure to effectively separate nanotubes of different electronic states has hindered the maturation of carbon nanotube hybrid device structures. Any method common in the art can be used to separate the semiconducting carbon nanotubes and conducting carbon nanotubes.

Transfer

Next, an electrical device may be further created out of such a carpet, film, and/or array by transferring such carpet, film, and/or array from the substrate to a second substrate (a conducting substrate) with good electrical contact.

In various embodiments, the contact is an ohmic contact.

Any method of transfer may be utilized that effectively transfers the nanotube carpet, film, and/or array from the growth substrate to a conductive surface and/or substrate. Transfer of VA-CNT films has been performed using aqueous treatments to debond a film from the growth substrate and deposit it onto another surface. Such physical treatments will create a high degree of contact between the film and the deposited layer; such contact is vital to most applications for these films. Other transfer methods have been successful in transferring VA-MV/NT films to metal surfaces while maintaining contact between the film and the substrate.

In an embodiment of a flip-over procedure, a VA-SWNT film can be used. It is common that a film fabricated and/or grown as herein illustrated will be tangled on an extending surface, however, the bundles at the bottom of the as-grown film are aligned normal to the substrate; therefore, a transfer method which exposes the bottom of the as-grown film for application is extremely useful.

For example, a cement, such as a ceramic cement, can be used to secure a film (carpet) to the substrate. It is believed that any film of nanotubes can be used, as required by the desired application. After curing of the cement, the film may be detached by a mechanical force applied between two substrates, by cutting, and/or any other manner common in the art. An optically flat surface of the vertically aligned nanotubes is then presented from the lower surface.

In various embodiments, the bundle tips of nanotubes created are resilient to high temperature because of the fabrication process. Accordingly, process conditions or the bonding material, such as, but not limited to cement, used can be varied to control characteristics of the bundles in the carpet.

Various methods may be used for separating the as grown nanotubes from the substrate. In an embodiment, pressure is used to separate the nanotubes from the substrate. In an embodiment, the pressure is high pressure between 10 and 200 lb/cm tends to produce a bending of the nanotubes in the carpet. However, any pressure can be used sufficient to shear the bond of the nanotubes and the substrate. In an embodiment, the application of sufficient force creates a shearing force between the nanotube and the substrates at the points of contact.

Results indicate that transferred carpets with this method create a good mechanical connection with the subsequently applied substrate as is indicated by increased resistance to destruction by sonication. It is thought that this procedure mechanically stabilizes the structure of the film. Kim et al., "Efficient Transfer of a VA-SWNT Film by a Flip-Over Technique," *J. Am. Chem./Soc.* 2006, 128, 9313

In an alternate embodiment, a carpet is coated in a mechanically at least partially contiguous film adhering to the carpet surface. In an embodiment, the coating completely covers the carpet. Various procedures to coat the carpet are sputtercoating, evaporation deposition, solvent deposition, and/or the like. In general any method may be used that does not disrupt the nanotube morphology (film/carpet) to a point wherein the nanotube morphology is no longer functional. A force is applied to debond the carpet from the growth substrate.

In an alternate embodiment, a carpet is removed from a substrate by using a corrosive solution to debond the carpet from the growth substrate (by attacking the catalyst or by attacking the growth substrate) and floating the film on the liquid surface, setting this wet film onto a new (conductive) surface and freeze drying it or taking it through a supercritical fluid phase to remove the liquid without damage to the morphology from surface tension effects of a liquid.

Flip-over—A Method of Transfer

In a method of Transfer, the removed nanotube is then flipped over, such that the surface adjacent the growth substrate is exposed.

In various embodiments, the flipped nanotube film and/or carpet is transferred to a second substrate. The second substrate can be used for further modification of the film, further growth, storage, transfer, and/or the like. In other embodiments, the carpet is transferred directly to a conductive surface.

In various embodiments, patterning of the nanotubes may be desired. It has been observed by practicing an embodiment of a method of the present invention as herein described, that extended heat treatment of as-transferred films/carpets is capable of causing the gold to bead, thereby carrying the embedded VA-SWNT film with it, drawing the VA-SWNT films into denser "islands" or clusters instead of a uniform film Kim et al., "Efficient Transfer of a VA-SWNT Film by a Flip-Over Technique," *J. Am. Chem. Soc.* 2006, 128, 9313.

Accordingly, to pattern a growth of nanotube(s), in an embodiment utilizing a metal layer, a layer of material under the metal can be patterned with various regions of different wetting characteristics for the molten metal. Wetting is the contact between a fluid, in this case, the molten metal, and a surface of the substrate (or other surface), when the two are brought into contact. When a molten metal has a high surface tension (strong internal bonds), it will form a droplet, whereas a molten metal with low surface tension will spread out over a greater area (bonding to the surface). On the other hand, if a surface has a high surface energy (or surface tension), a drop will spread, or wet, the surface. If the surface has a low surface energy, a droplet will form. This phenomenon is a result of the minimization of interfacial energy. If the surface is high energy, it will want to be covered with a liquid because this interface will lower its energy, and so on. Accordingly, the characteristics of the molten metal and/or substrate may be modified to adjust the pattern of the nanotube growth from the substrate.

In an example of patterning, at least one column of nanotubes is formed. In order to define where this at least one column of nanotubes will be, higher melting point metal (for example, Pt) particles of a metal which is miscible with the metal used for the layer (for example, Au) can be placed under the metal film on the transfer substrate. Upon flowing behavior such at lower temperatures (such that the Au experiences melting or partial melting but the Pt remains substantially intact) the Au film will tend to bead onto Pt particles. Thus the pattern of these particles will determine the pattern of nanotube columns produced. For very small diameter columns it may be necessary to include a further step to separate the nanotube bundles (such as by oleum intercalation) followed by the removal of the of the separating species (such as removal of the oleum, gentle liquid exchange and/or supercritical removal may be necessary to avoid disruption by mass flow and surface tension effects).

Electrical Contact

The 'flipped over' carpet is electrically contacted from the top. Any method of electrically contacting may be used, as is common in the art.

Various contemplated methods include, but are not limited to simple mechanical placement of a contact on the surface of the carpet, by deposition of a conductive layer on the carpet, by means such as evaporation, sputtering, CVD, electrochemical deposition, and/or the like. Deposited contacts are desirable for the higher surface area contact for the junction, leading to a lower effective contact resistance for the junction.

However, in various embodiments no electrical contact is made from the top. In that manner, a very high energy density capacitor can be fabricated. The nanotubes carpet would not act as an energy conduit but rather as an energy storage device.

In an embodiment, the conductive layer/contact comprises a suitable material for the particular purpose, including, but not limited to, single or dual damascene copper interconnects, poly-silicon interconnects, silicides, nitrides, and refractory metal interconnects such as, but not limited to, Al, Ti, Ta, Ru, W, Nb, Zr, Hf, Ir, La, Ni, Co, Au, Pt, Rh, Mo, and their combinations.

The steps of Growing, Transferring and Flipping may, in various embodiments, be re-ordered.

Insulating

An insulating material or materials is then coated onto individual tubes and/or bundles of tubes (nanotubes) to isolate the tubes and/or bundles from the gating material. In an embodiment, the insulating material completely covers the tubes and/or bundles. In an alternate embodiment, gaps or other discontinuities are present in the coating such that the tubes and/or bundles are not completely covered.

The insulating material can take a variety of forms including polymeric, oxide materials, and/or the like.

In an embodiment, polymeric materials can be deposited by means such as self-assembly by liquid phase hydrophobic/hydrophilic interactions. Oxide materials can be deposited by a variety of means including, but not limited to, (1) liquid phase methods such as oxide deposition from metal-organic precursors or aqueous solutions of dissolved precursors (such as waterglass), (2) ALD methods wherein ALD methods may be assisted by using species which decorate the surface of the nanotubes or nanotube bundles. Gordon et al., "ALD of High-k dielectrics on suspended functionalized SWNTs, Electrochemical and Solid-State Letters," 8 (4) G89-G91 (2005) and Lu et al., "DNA Functionalization of Carbon Nanotubes for Ultra-Thin Atomic Layer Deposition of High k Dielectrics for nanotube Transistors with 60 mV/decade Switching," arXiv:cond-mat/0602454; and, (3) Conformally coating CVD methods (as disclosed in FIGS. 7-9). Fahlman et al., "CVD of Conformal Alumina Thin Films via Hydrolysis of $AlH_3(NMe_2Et)$," Adv. Mater. Opt. Electron 10, 135-144 (2000).

As well, in various embodiments, the conductive substrate, the source, and the drain is coated tubes and/or bundles of tubes (nanotubes) to isolate the tubes and/or bundles from the gating material, thereby forming a matrix.

In an alternate embodiment, a material is conformably coated onto the insulator which is coating the nanotubes, thereby forming a matrix.

Infiltration

In various embodiments, a conductive material is then infiltrated into the coated insulated nanotubes or matrix to gate each tube and/or to gate each pillar and have electrical connection between the all of the gating material deposited within each electrical device.

Various procedures common in the art include, but are not limited to a variety of methods for depositing a conducting gate material. In an embodiment, the method and/or procedure is chosen from at least one of wet chemical depositions, CVD infiltration, atomic layer deposition, and/or the like. Generally, any method common in the art can be used.

Connection of Electrical Device

In various embodiments, an electrical device of the present invention can then be connected to a working device, such as by wiring into a source-gate-drain configuration by standard methods appropriate to specific device configuration and size.

Various non-limiting procedures include standard lithographic, circuit layout, micro/nanofabrication methods, and/or the like. Generally any method common in the art can be used.

Alternate Embodiments

In an alternate embodiment, It has been shown by Burke (Solid-State Electronics 48 (2004) 1981-1986) that the frequency performance of nanotube based transistors is limited by gate length and the relatively high impedance mismatch possessed of single and few tube transistors. The Vertical Electrical device concept previously disclosed allows both of these considerations to be efficiently dealt with.

Since the Vertical FET concept previously disclosed most naturally creates devices from several or many tubes in parallel the impedance mismatch may be eliminated or reduced with respect to other nanotube devices.

Very high frequency devices built from carbon nanotubes are possible if the gate length is kept small and the parasitic capacitance between the gate and contact electrodes is also kept small. Methods may be used to deposit the metal gate preferentially near the center of the nanotube structure and away from the two metal gating electrodes. These methods include engineering self-limiting assembly and nanolithography.

To produce such a device based on self-limiting assembly, the following procedure is outlined:

1) A standard carpet is grown, potentially patterned, and affixed to an electrode, the undesired tubes are contributionally removed (either physically destroyed or chemically modified so that they do not electronically contribute to the device), another electrode is intimately contacted to the nanotubes at the free (non-affixed) end of the carpet. Where the metal chosen for the electrodes is chosen such that ALD (or other self-limiting or self-organizing) chemistry may be selectively performed on the surface of the metal and not on the surface of the nanotubes. Precursors are capable of being chosen which require high temperature deposition onto the surface of the electrode such that these precursors will stick to the electrode surface for ALD but not to the surface of the nanotubes. Many precursors which require high temperature processing are well known and characterized with respect to deposition on the surface of metals. It is preferable to the reduction of parasitic capacitance if this layer is made of a low dielectric constant material.

2) Selective ALD of an insulator layer is performed such that this insulator will deposit on the surface of the electrodes but not on the surface of the nanotubes. ALD conditions are chosen such that only a relatively thin layer remains uncoated between the electrodes. This layer will define the channel and thus control the channel length.

3) ALD is performed which will coat the nanotubes in the carpet in a thin layer of insulating material.

4) Metal (a conductive material) is infiltrated into the structure. This may be achieved by various methods such as ALD, metal infiltration CVD, liquid metal infiltration (potential under the influence of a bias), etc.

By the above described alternate embodiment a channel length of controlled dimensions can be produced where the channel is maximally distant from the contact electrodes without the need to develop a nanolithography technique to separately define the channel.

In yet an alternate embodiment, a modification to the step and/or process of coating of the carpet with an insulator produces enhanced results. As an alternative to a transistor type of electrical device, a process of the present invention wherein the 'top' (later applied) conductive layer is not present, a capacitor type of electrical device is produced.

Utilizing the tubes as charge storage elements fabricates a very high energy density capacitor. In various embodiments, to produce devices which with enhanced energy storage density, the use of high-k dielectrics is advantageous. Furthermore, other electrode materials such as nanoporous carbon and/or the like can be used to as a substitute for the tubes.

As such, embodiments of the present invention are capable of fabricating electrical devices and/or arrays of electrical devices. In various embodiments, the semiconducting carbon nanotubes are incorporated as a channel region of an electrical device. Further, conducting carbon nanotubes are capable of being used as a component of a gate contact and/or a source contact.

In an embodiment, adjacent electrical devices are spaced apart such that, as the carbon nanotubes lengthen, the flow of CVD reactant(s) to a catalyst material supporting nanotube synthesis does not become restricted. Because the nanotube synthesis is unencumbered by significant flow restrictions, the carbon nanotubes may be grown at a higher rate to a greater length. Accordingly, electrical devices and/or arrays of electrical devices may be formed by mass production with methods of the present invention.

With the description as provided below, it is readily apparent to one skilled in the art that various processes described herein may be utilized in various configurations. For example, the present invention may be used in the formation of transistors, capacitors, interconnections, etc. for electrical devices, particularly various memory devices. Exemplary vertical transistor/capacitor cells for DRAM structures and methods for making the same are described below. The same is true as to exemplary interconnects and logic stacks for use in electrical circuitry such as memory cells. It is to be understood that these electrical structures and fabrication methods are only a few examples of many possible structures and methods for practice of the present invention. For example, carbon nanotubes are used to form the devices, but nanotubes formed of different materials may be used, such as silicon carbide. As another example, single or stacked capacitors could be formed.

Further, although only DRAMS are mentioned specifically, this invention is applicable to other electrical devices and particularly to all areas of memory and memory access technology including logic devices and all RAM and ROM devices (e.g., DRAM, SRAM, SCRAM, EDRAM, VDRAM, NVSRAM, NVDRAM, DPSRAM, PSDRAM).

An Illustration of a Fabrication Method and Electrical Device

A method for making at least one electrical device is illustrated in FIGS. 1-6. All steps herein described are performed by the methods and their equivalents as described in the detailed description. Likewise, as is understood by those skilled in the art, materials forming components of the described structures are not limited to those explicitly cited but may comprise any suitable material for the function performed by the component.

With reference to FIG. 1, a substrate 20 is provided. Substrate 12 is formed from any suitable material that may serve to form substrates for electrical devices. Useful substrate materials include, but are not limited to, doped or undoped silicon, doped or undoped polycrystalline silicon, gallium arsenide, gallium phosphide, and indium. Substrate 20 is then treated to form desired circuitry for the final device, to which the vertical transistor/capacitor cell structures comprised of carpet 10 will be connected. Carpet 10 is then grown on substrate 20 by any means common in the art or as herein disclosed.

With reference to FIG. 1 and FIG. 2, arrow 30 illustrates a flip-over as herein described wherein carpet 10 is flipped over on a substrate or contact 50.

FIG. 3 illustrates a contact or substrate 70 placed on carpet 10. In embodiments of a capacitor, an insulating layer rather than a conductive layer is used.

Figure 4:
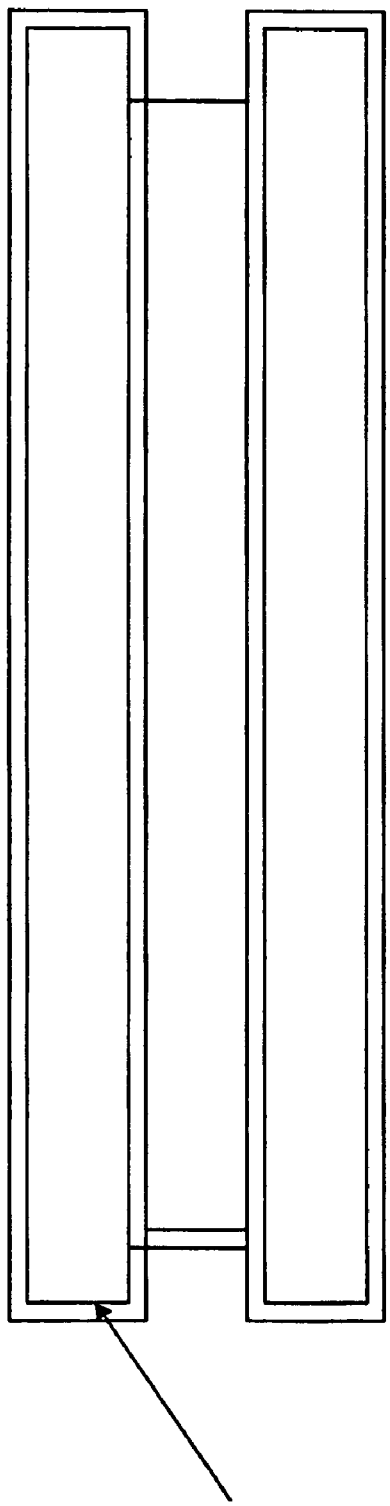
FIG. 4 is an illustration of a nanotube carpet growth from FIG. 3 with an insulation.

FIG. 4 illustrates an insulating procedure. Exemplary insulating materials to form the first insulation layer 80 and/or, if present, insulating polymer layers, include, but are not limited to silicon dioxide, nitrides, and oxides. Alternatively, plural insulating materials may be employed to form insulation layer 80.

Figure 5:
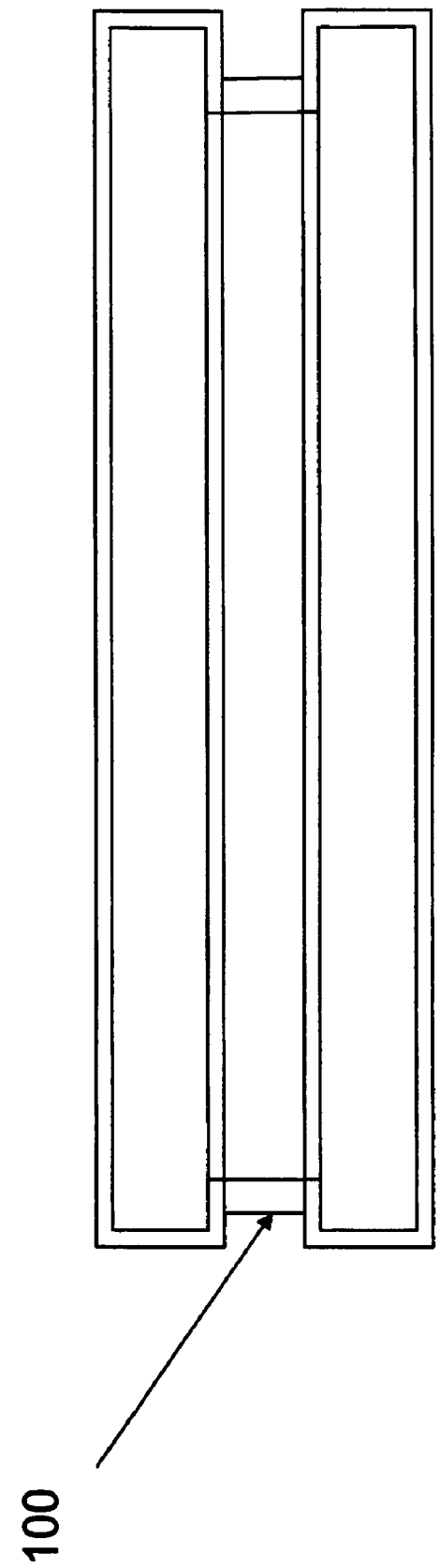
FIG. 5 is an illustration of a nanotube carpet growth from FIG. 4 with a conductive layer deposited.

FIG. 5 illustrates a Illustrates a metal infiltration of a conduction layer 100 applied to cover insulation layer 80. Nucleation layer 100 may be formed by a single application or by plural applications of suitable nucleation materials. Nucleation layer 100 may comprise any material capable of nucleating growth of a nanotube. Suitable examples include, but are not limited to, nickel, cobalt, iron, and the like.

Figure 6:
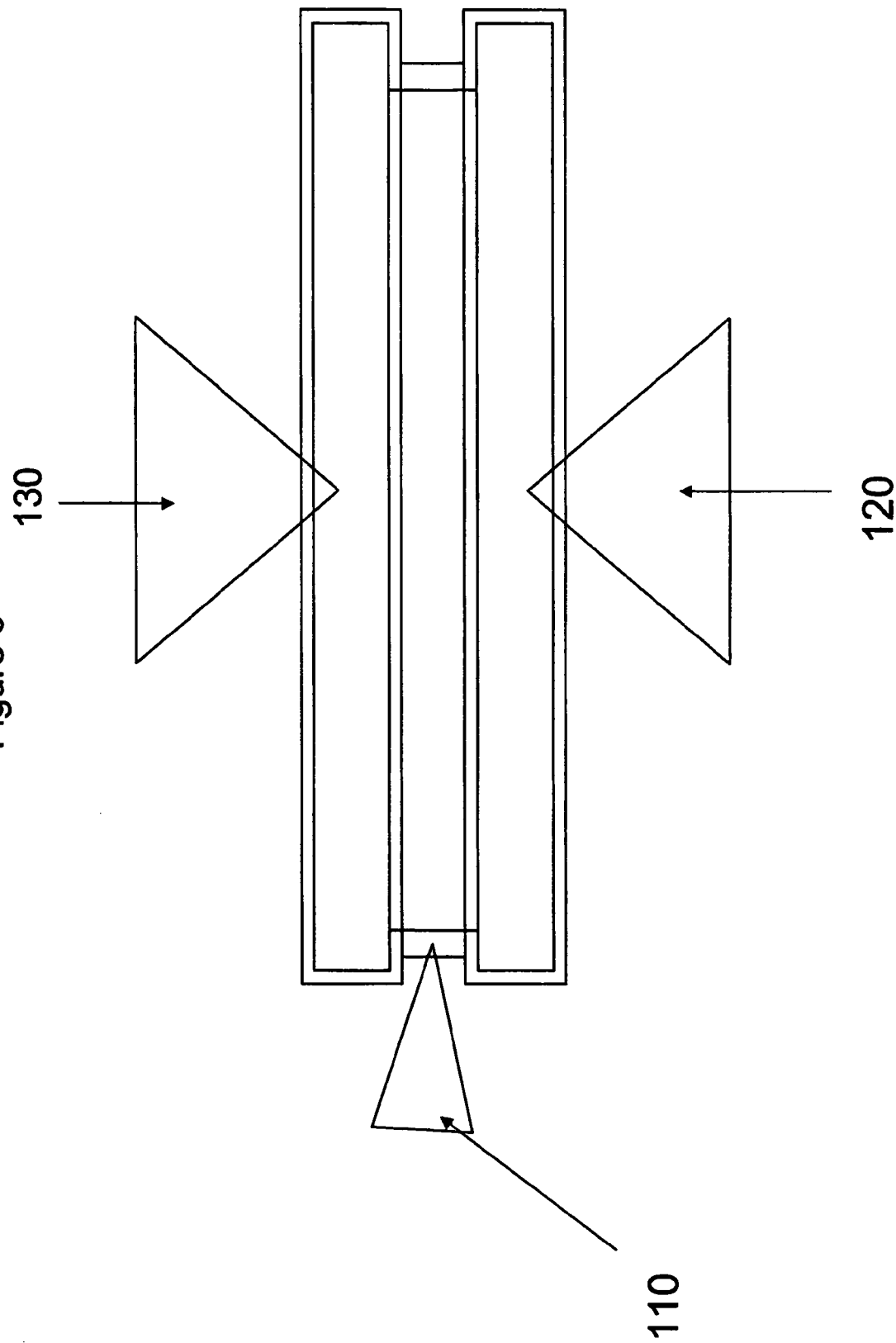
FIG. 6 is an illustration of a nanotube carpet growth from FIG. 5 with electrical contacts.

FIG. 6 illustrates the attachment of, for example, a drain contact 130, a source contact 120, and a gate contact 120.

In an alternate embodiment, a method for fabricating an electrical device of the present invention comprises the steps of:

1) growing a vertically aligned nanotube carpet;
2) transferring the nanotube carpet onto a second substrate;
3) insulating the nanotube carpet and the second substrate; and
4) applying a conductive layer to the nanotube carpet, wherein an electrical device is fabricated and/or an array of electrical devices is fabricated. In a further embodiment, the step of flipping the carpet flips isolated pillars of the carpet for fabricating more than one electrical device. In a further embodiment, the step of modifying the electrical properties of the carpet. In yet a further embodiment, the step of modifying comprises removing conductive tubes from the nanotube carpet.

In a further embodiment for producing capacitors and the like, the step of applying an electrical contact to the top of the flipped over carpet is made thus forming an electrical circuit. In a further embodiment, at least a portion of the electrical device is capable then of being electrically connected into a circuit. In an alternate embodiment, the carpet is flipped, such as by flip-over. In an embodiment, the carpet is patterned. In an alternate embodiment, a portion of the nanotubes comprising the carpet is conductive.

In various further embodiments, a method of the present invention further comprises applying a conductive second substrate to the nanotubes at the free end of the carpet, wherein a material chosen for the second substrate is chosen such that the material adheres to the second substrate but not substantially to the surface of the nanotubes, wherein a very high frequency device is capable of being fabricated.

In various further embodiments, an electrical device is fabricated according to a method as herein disclosed. In further embodiments, an array of devices if fabricated.

Various further embodiments generally relate to methods of reducing the heat generated from an integrated circuit comprising the step of replacing the integrated circuit's silicon with a carbon nanotube formation as herein disclosed.

Various further embodiments generally relate to methods of increasing the operating speed of an electrical device comprising the step of replacing the integrated circuit's silicon with a carbon nanotube formation as herein disclosed.

EXAMPLES

Developments in the art field coupled with the novel and non-obvious additions of this disclosure illustrate enablement of the appended claims. Namely, Applicants have discovered an improved method of fabrication of various electrical devices, such devices and arrays of such devices.

It has been shown that carpets (forests) of vertically aligned single walled nanotubes of approximately uniform height can be grown onto substrates (generally alumina). See Hata et al., "Water-Assisted Highly Efficient Synthesis of Impurity-Free Single-Walled Carbon Nanotubes," *Science* 2004, 306, 1362-1364; Murakami et al., "Growth of vertically aligned single-walled carbon nanotube films on quartz substrates and their optical anisotropy," *Chemical Physics Letters* 2004, 385, 298-303; Xu et al., "Vertical Array Growth of Small Diameter Single-Walled Carbon Nanotubes," *J Am Chem Soc* 2006, 128, 6560-6561.

Growth

An example of growing carbon nanotubes with optical anisotropy is as follows:

Generally, a bimetallic Co—Mo catalyst was supported on a quartz substrate by dip-coating the substrate in an acetate solution. In an embodiment, the quartz substrate is baked in air at 500° C. in an electric furnace just before nanotube growth. In an embodiment, the substrate is coated with an ethanol solution of Co and Mo acetates, each with a metal content of about 0.01 wt %. The substrate is then heated to convert the metal to metal oxides. In an embodiment, the substrate is heated at 400° C. to convert the acetates to metal oxides. In an embodiment, the metal oxides are reduced, such as by flowing 300 sccm Ar/H (about 3% $H_2$) to retrieve its catalytic activity for the CVD reaction. When the electric furnace reached the SWNT growth temperature of 800° C. The supply of Ar/H gas is cut off to allow random generation of growth parallel to the substrate surface or the supply of Ar/H gas is continued during the CVD reaction to produce a dense growth of vertically aligned SWNTs on the surface.

A reported example of this procedure was conducted for 1 hour with 10 Torr of ethanol as a carbon source. Murakami et al., *Chem. Phy, Let.* 2004, 385, 298-299. The flow rate of Ar/H (3% $H_2$) gas was fixed at 300 sccm, at 300 Torr during the heat-up stage and a partial pressure of 7 Torr during the CVD reaction, being controlled by a degree of evacuation. A quartz tube is reported as being used for the CVD apparatus substrate. The quartz tube substrate was placed down-stream of the furnace so as to let the gases passing over the specimen uniformly reach the furnace temperature. The background pressure of the CVD chamber was kept below $2 \times 10^{-2}$ Torr to ensure reproducibility.

Flip-over

It has furthermore been demonstrated that these carpets can be transferred ("flipped over") onto a conductive substrate with good mechanical adhesion properties and that this assembly can be contacted to a conductive channel on the other end forming a conductive channel through the SWNT carpet. Kim et al., "Efficient Transfer of a VA-SWNT Film by a Flip-Over Technique," *J. Am. Chem./Soc.* 2006, 128, 9312-9313 and Murakami, et al., "Detachment of vertically aligned single-walled carbon nanotube films from substrates and their re-attachment to arbitrary surfaces," *Chem. Physics Letters* 2006, 422, 575-580.

In this embodiment, VA-SWNT films are used for the fabrication of field emission devices or electrodes for a capacitor, a fuel cell, and/or a super capacitor.

In the embodiment described, a ceramic cement (Omega CC High Temperature cement) was mixed with liquid binder and spread uniformly on a silicon wafer. A VA-SWNT film was applied to cement mixtures and cured for 24 h at room temperature or 4 h at 65° C. After curing, a VA-SWNT film was detached by a mechanical force applied between two substrates. Thus creating an optically flat surface of exposed carbon nanotube bundle tips which is mechanically strong and resilient against high-temperature.

A further example of flip-over comprises fusing two like metal surfaces. For example, a gold layer is capable of being deposited on a wafer, such as by a sputter coater or an c-beam evaporator, onto both a Si wafer coated in a thin Pt layer and onto a VA SWNT film. The gold-coated VA-SWNT film can then be pressed against the gold-coated Si wafer. Baking at an elevated temperature, such as 800° C. for 5 min in an Argon environment, will fuse the two gold films. High pressure, at least around 55 $lb/cm^2$ tends to produce a bending of the nanotubes in the carpet which is retained with a wavy morphology. Such bending also shears the nanotube and the substrate at the point of contact.

Contact

The 'flipped over' carpet is electrically contacted from the top. Any method of electrically contacting may be used, as is common in the art.

Various contemplated methods include, but are not limited to simple mechanical placement of a contact on the surface of the carpet, by deposition of a conductive layer on the carpet, by means such as evaporation, sputtering, CVD, electrochemical deposition, and/or the like. Deposited contacts are desirable for the higher surface area contact for the junction, leading to a lower effective contact resistance for the junction.

However, in various embodiments no electrical contact is made from the top. In that manner a very high energy density capacitor can be fabricated. The nanotubes carpet would not act as an energy conduit but rather as an energy storage device.

The steps of Growing, Transferring and Flipping may, in various embodiments, be re-ordered.

Insulating

An insulating material or materials is then coated onto individual tubes and/or bundles of tubes (nanotubes) to isolate the tubes and/or bundles from the gating material. In an embodiment, the insulating material completely covers the tubes and/or bundles. In an alternate embodiment, gaps or other discontinuities are present in the coating such that the tubes and/or bundles are not completely covered.

As well, in various embodiments, the conductive substrate, the source, and the drain is coated a tube and/or bundle of tubes (nanotubes) to isolate the tube and/or bundle from the gating material, thereby forming a matrix.

In an alternate embodiment, a material is conformably coated onto the insulator which is coating the nanotubes, thereby forming a matrix.

Infiltration

In various embodiments, a conductive material is then infiltrated into the coated insulated nanotubes or matrix to gate each tube and have electrical connection between the all of the gating material deposited within each electrical device.

Various procedures common in the art include, but are not limited to a variety of methods for depositing a conducting gate material. In an embodiment, the method and/or procedure is chosen from at least one of wet chemical depositions, CVD infiltration, atomic layer deposition, and/or the like. Generally, any method common in the art can be used.

An exemplary embodiment of a coating process is illustrated in FIGS. 7 and 8.

FIG. 7 is an illustration of a forest or carpet 220 of nanotubes 210. A forest, in an embodiment, comprises at least one nanotube 210 grown on a growth substrate that then may be transferred to a conductive or transfer substrate 200.

Reference to FIG. 8 illustrates a coating process. In an embodiment, at least one nanotube 260 is coated with an insulation material 270 and infiltrated by a metal layer 280 such as by MOCVD or other appropriate method.

Connection of Electrical Device

In various embodiments, an electrical device of the present invention can then be connected to a working device, such as by wiring into a source-gate-drain configuration by standard methods appropriate to specific device configuration and size. Various non-limiting procedures include standard lithographic, circuit layout, micro/nanofabrication methods, and/or the like. Generally any method common in the art can be used.

In an Exemplary Embodiment of Fabricating a Field Effect Transistor

1) A single walled nanotube (SWNT) carpet of desired properties is grown;

2) The SWNT carpet is flipped over onto a conductive substrate as isolated pillars of carpet growth for forming multiple electrical elements;

3) The SWNT carpet electrical properties are modified if needed (current as grown carpets are made of a variety of semiconducting and metallic tubes, for optimum transconductance properties of this device it is desirable for the metallic tubes to be eliminated as current carrying channels within the device;

4) An electrical contact to the top of the flipped over carpet is made thus forming an electrical circuit;

5) An insulation coating is deposited on the surface of the tubes (individually or as small bundles) and electrical connections to the carpet.

6) A conductive layer is deposited surrounding the tubes in the carpet such that the all of the conductive layer is in contact with all other portions of the conductive layer, thus forming a singly acting gate for all the tubes in an element.

7) Each element is capable then of being electrically connected into a transistor circuit.

A vertical FET device based on this method will allow at least one of ease of fabrication for applications such as high power transistors (owing at least in part to the high conductivity of carbon nanotubes and the high gating efficiency of this device), high speed transistors (if the gate length is decreased then the RC will be low enough to allow high speed switching and carbon nanotubes will be able to withstand significantly higher power than silicon due to material resilience and the lack of required doping), ease of fabrication into integrated circuit configurations, creation of very high voltage transistors, and/or the like.

Vertical FETs of carbon nanotube materials well connected to other materials have the advantage of high heat conduction through their body and thus dissipate heat very quickly. Furthermore, the general method of fabrication detailed throughout, in various embodiments, allows for the fabrication procedure to be self-limiting in the fabrication of devices rather than reliance upon external lithography and/or applied mechanics. Integrated circuits made from these devices have potential to compete with other technologies due to the potential high operating speeds, temperature resistance, resistance to damage from physical and electrical shock, and/or the like.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes to the claims that come within the meaning and range of equivalency of the claims are to be embraced within their scope. Further, all published documents, patents, and applications mentioned herein are hereby incorporated by reference, as if presented in their entirety.

What is claimed is:

1. A method for fabricating an electrical device, said method comprising:
   growing a vertically aligned nanotube carpet on a first substrate;
   transferring the nanotube carpet onto a second substrate;
   insulating the nanotube carpet; and
   applying a conductive layer around the insulated nanotube carpet.

2. The method of claim 1, wherein transferring the nanotube carpet comprises flip-over or flipping of the carpet.

3. The method of claim 1, wherein the carpet comprises transferring isolated pillars of the carpet.

4. The method of claim 1, further comprising: modifying the electrical properties of the carpet.

5. The method of claim 4, wherein modifying comprises removing conductive nanotubes from the carpet.

6. The method of claim 2, further comprising: applying an electrical contact to a surface of the flipped over carpet to form an electrical circuit.

7. The method of claim 1, wherein at least a portion of the electrical device is capable of being electrically connected into a circuit.

8. The method of claim 7, further comprising flipping the carpet.

9. The method of claim 1, wherein growing the carpet further comprises patterning the carpet.

10. The method of claim 1, wherein at least a portion of the carpet comprises conductive nanotubes.

11. The method of claim 1, further comprising: applying a conductive substrate to the carpet at the free end of the carpet.

12. The method of claim 1, wherein the electrical device is selected from the group consisting of transistors, capacitors, supercapacitors, batteries, and memory devices.

* * * * *

UNITED STATES PATENT AND TRADEMARK OFFICE
CERTIFICATE OF CORRECTION

PATENT NO. : 8,394,664 B2  Page 1 of 1
APPLICATION NO. : 11/910522
DATED : March 12, 2013
INVENTOR(S) : Nicholas et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1256 days.

Signed and Sealed this

First Day of September, 2015

Michelle K. Lee
*Director of the United States Patent and Trademark Office*